United States Patent [19]
Shimizu et al.

[11] Patent Number: 5,594,265
[45] Date of Patent: Jan. 14, 1997

[54] INPUT PROTECTION CIRCUIT FORMED IN A SEMICONDUCTOR SUBSTRATE

[75] Inventors: Mitsuru Shimizu, Sakura; Syuso Fujii, Kawasaki; Kenji Numata, Yamato; Masaharu Wada, Yokohama, all of Japan

[73] Assignee: Kabushiki Kaisha Toshiba, Kawasaki, Japan

[21] Appl. No.: 799,342

[22] Filed: Nov. 27, 1991

[30] Foreign Application Priority Data

Nov. 30, 1990 [JP] Japan ................... 2-340617
Nov. 30, 1990 [JP] Japan ................... 2-340618

[51] Int. Cl.⁶ .......................................... H01L 23/62
[52] U.S. Cl. ............. 257/355; 257/356; 257/358; 257/361; 257/362; 257/363
[58] Field of Search ................... 357/23.6, 23.13, 357/47, 48; 257/355, 356, 357, 358, 359, 360, 361, 362, 363

[56] References Cited

U.S. PATENT DOCUMENTS

| | | | |
|---|---|---|---|
| 3,787,717 | 1/1974 | Fischer et al. | 357/23.13 |
| 4,688,065 | 8/1987 | Kinoshita et al. | 357/23.13 |
| 4,757,363 | 7/1988 | Bohm et al. | 257/362 |
| 4,994,874 | 2/1991 | Shimizu et al. | 357/23.13 |
| 5,010,380 | 4/1991 | Avery | 357/23.13 |
| 5,016,078 | 5/1991 | Tailliet | 357/35 |
| 5,072,271 | 12/1991 | Shimizu et al. | 357/23.13 |

FOREIGN PATENT DOCUMENTS

| | | | |
|---|---|---|---|
| 0324185 | 12/1988 | European Pat. Off. | 257/362 |
| 2722892 | 5/1977 | Germany | 257/362 |
| 58-121663 | 7/1983 | Japan | 257/335 |
| 58-161375 | 9/1983 | Japan | 357/23.13 |
| 59-111351 | 6/1984 | Japan | 357/23.13 |
| 60-107865 | 6/1985 | Japan | 357/23.13 |
| 62-224057 | 10/1987 | Japan | 257/355 |
| 63-137478 | 6/1988 | Japan | 257/360 |
| 63-220564 | 9/1988 | Japan | 357/23.13 |
| 1-286354 | 11/1989 | Japan | 257/360 |
| 2-119262 | 5/1990 | Japan | 257/355 |

OTHER PUBLICATIONS

Momodomi, "A Circular Output Protection Device Using Bipolar Action", 25th Annual Proceedings–Reliability Physics, Apr., 1987, pp. 169–173.

*Primary Examiner*—Steven H. Loke
*Attorney, Agent, or Firm*—Banner & Witcoff, Ltd.

[57] ABSTRACT

According to the invention, a well region is formed on a semiconductor substrate. An n⁺-type first semiconductor region is formed in the well region, and an input pad for receiving an external signal is connected near the first semiconductor region. This input pad is connected to an input circuit of an integrated circuit constituted by an inverter circuit and to an external terminal for receiving an external signal. N⁺-type second semiconductor regions are formed in the well region located on both sides of the first semiconductor region. A ground potential Vss is applied to these second semiconductor regions. A p⁺-type third semiconductor region is formed around these second semiconductor regions in the well region. The ground potential is applied to the third semiconductor region. Therefore, a parallel circuit formed by a parasitic transistor and a parasitic diode is formed between the input pad and the ground potential. The parasitic transistor is turned on upon electrostatic discharge, and the parasitic diode is turned on when a negative potential for test is applied to the input pad, thereby preventing an erroneous operation of a transistor arranged on the semiconductor substrate.

13 Claims, 9 Drawing Sheets

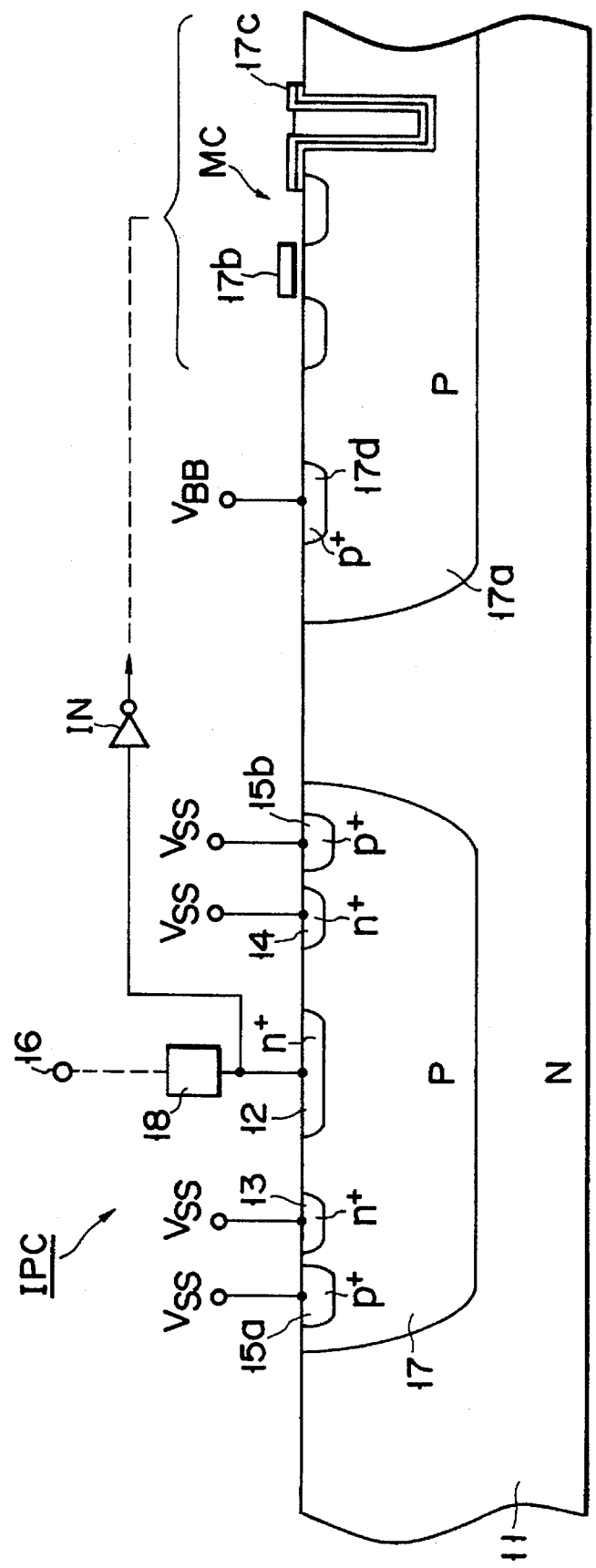
F I G. 3

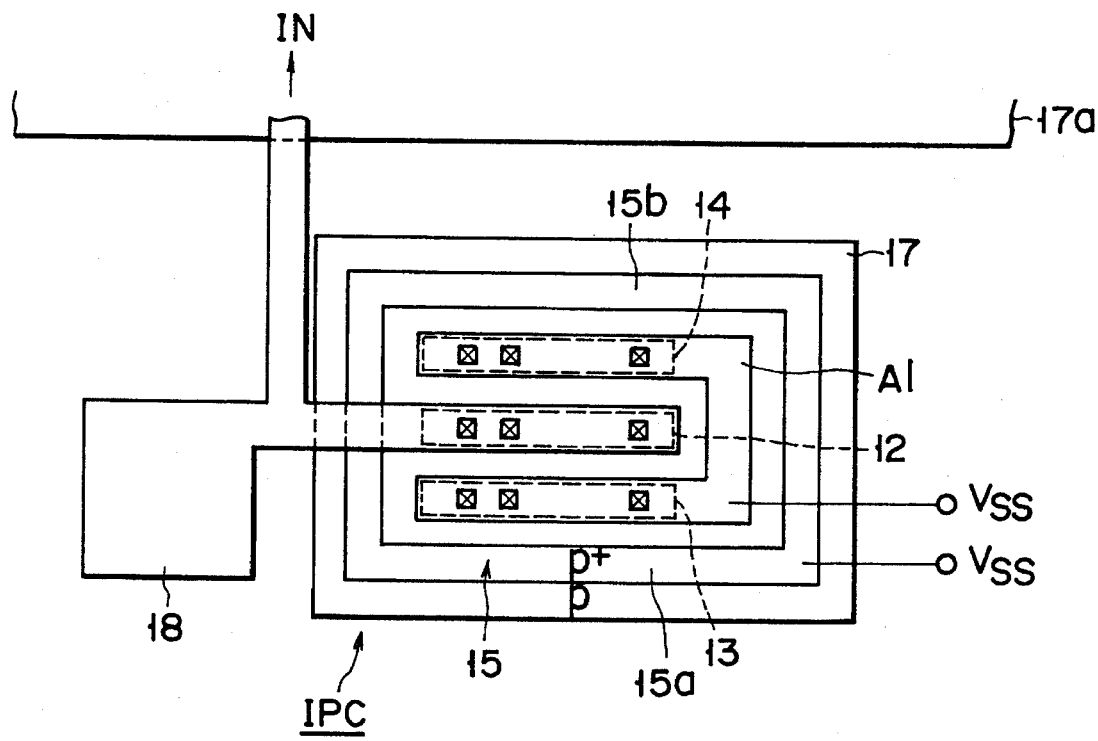
F I G. 4
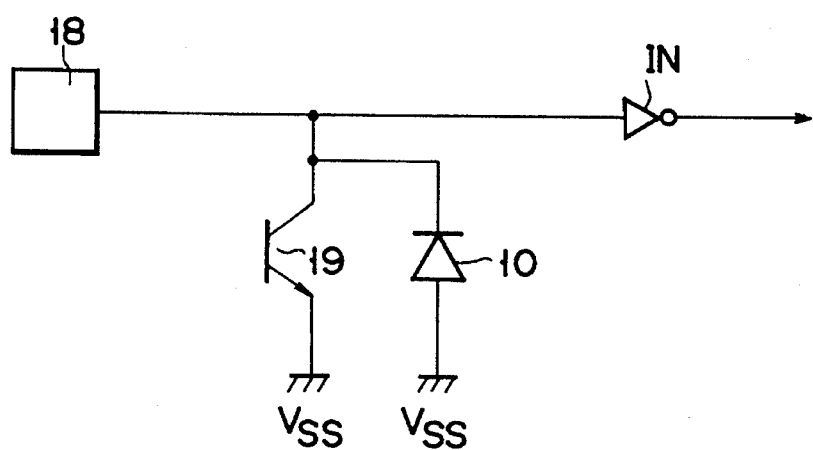
F I G. 5

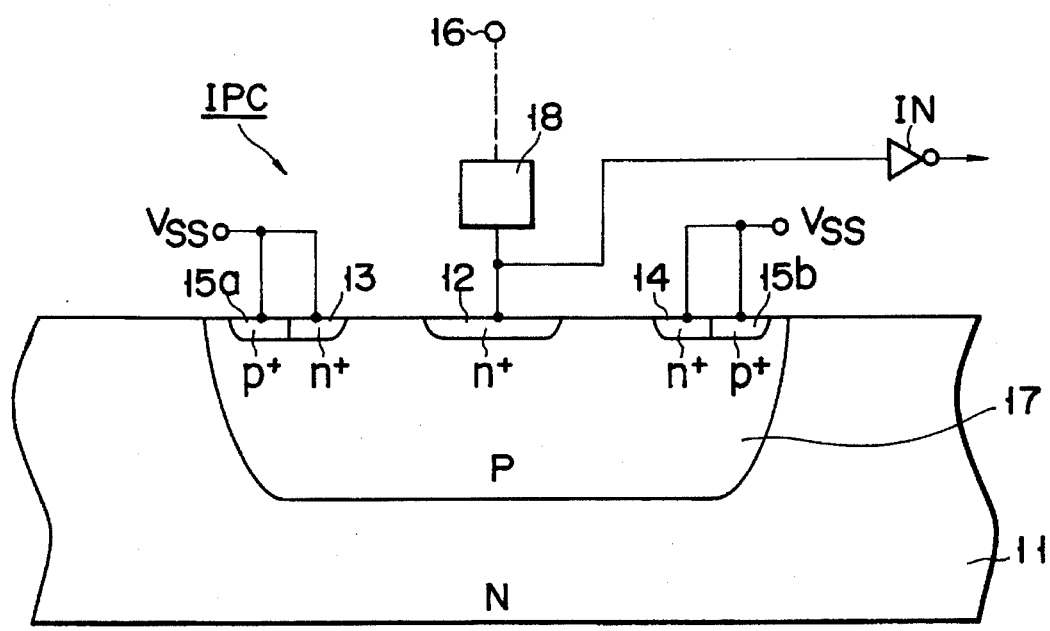
F I G. 6
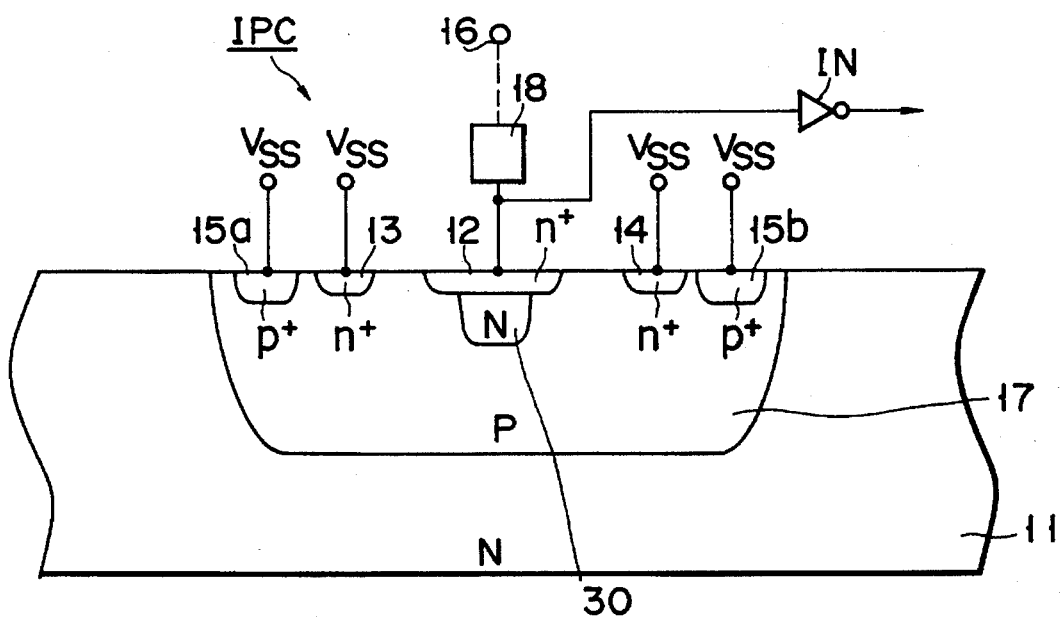
F I G. 7

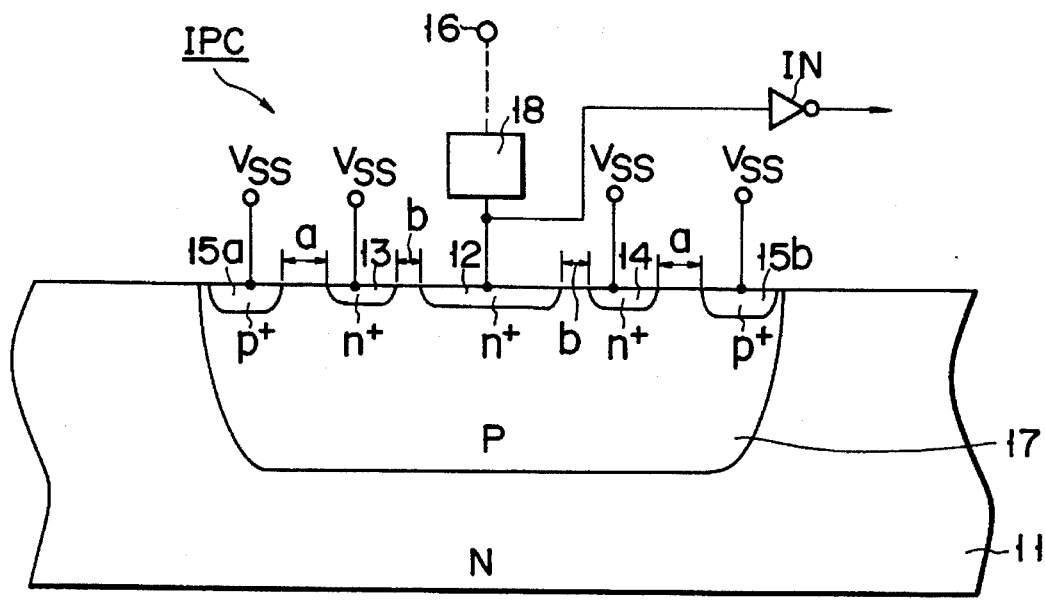
F I G. 8
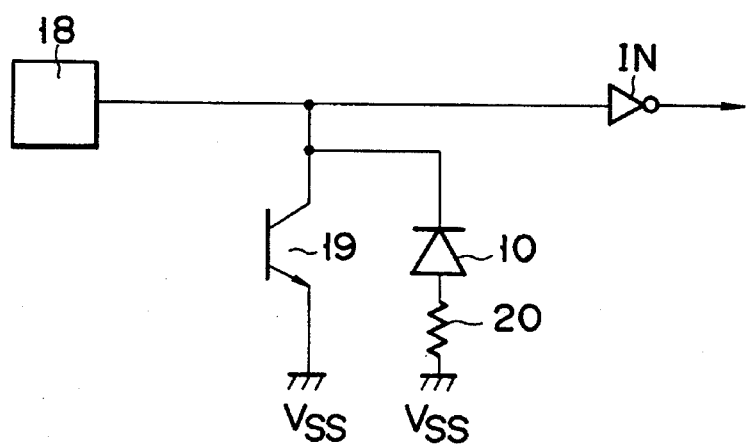
F I G. 9

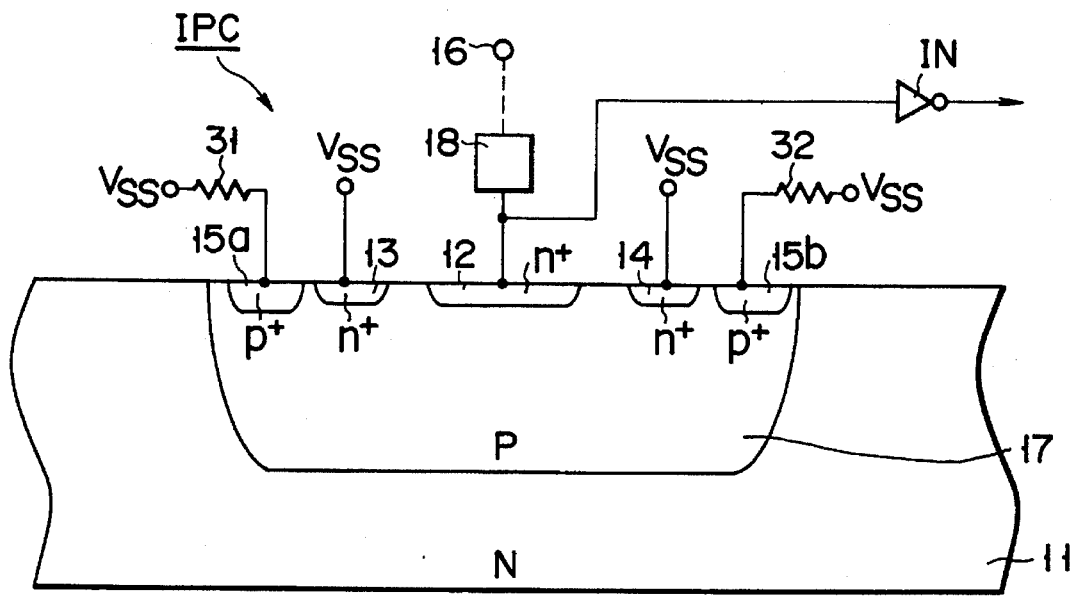
F I G. 10
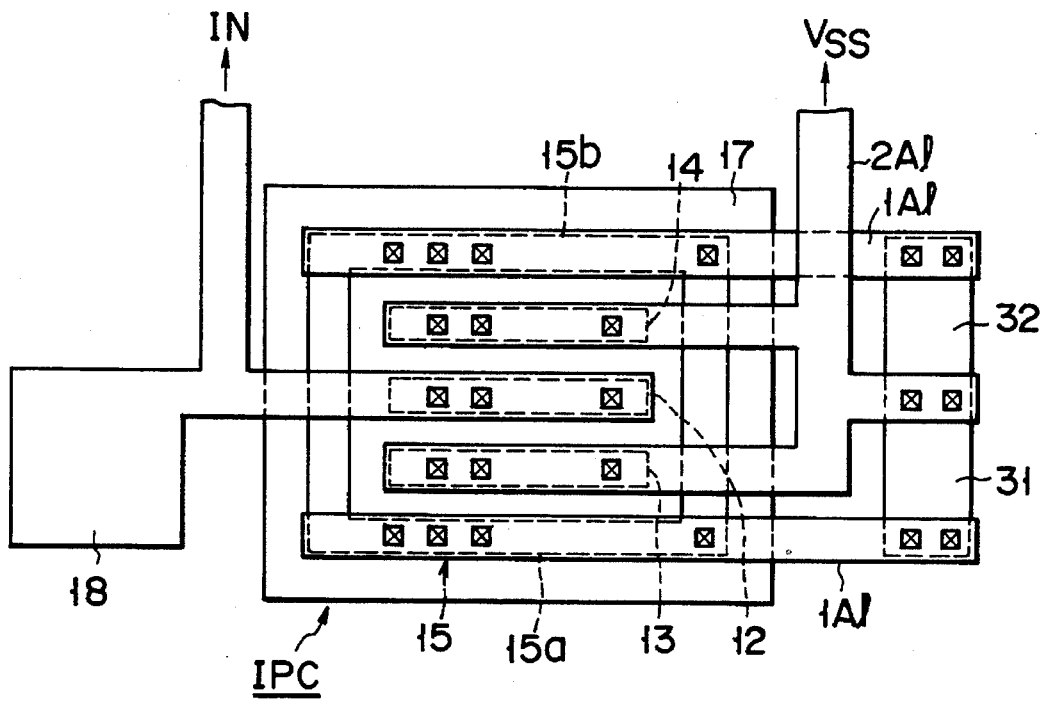
F I G. 11

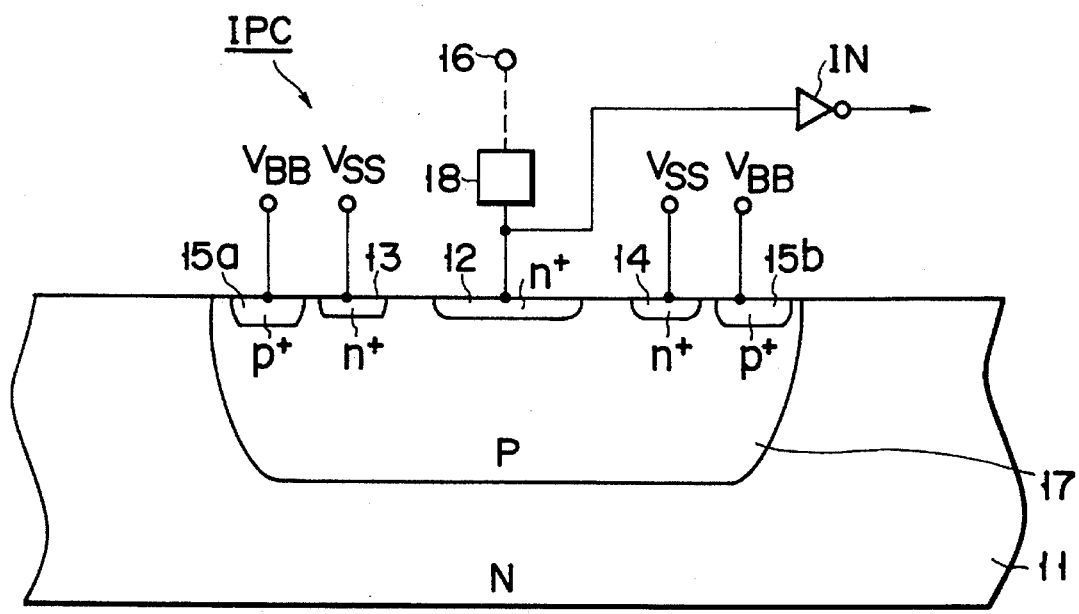
F I G. 12
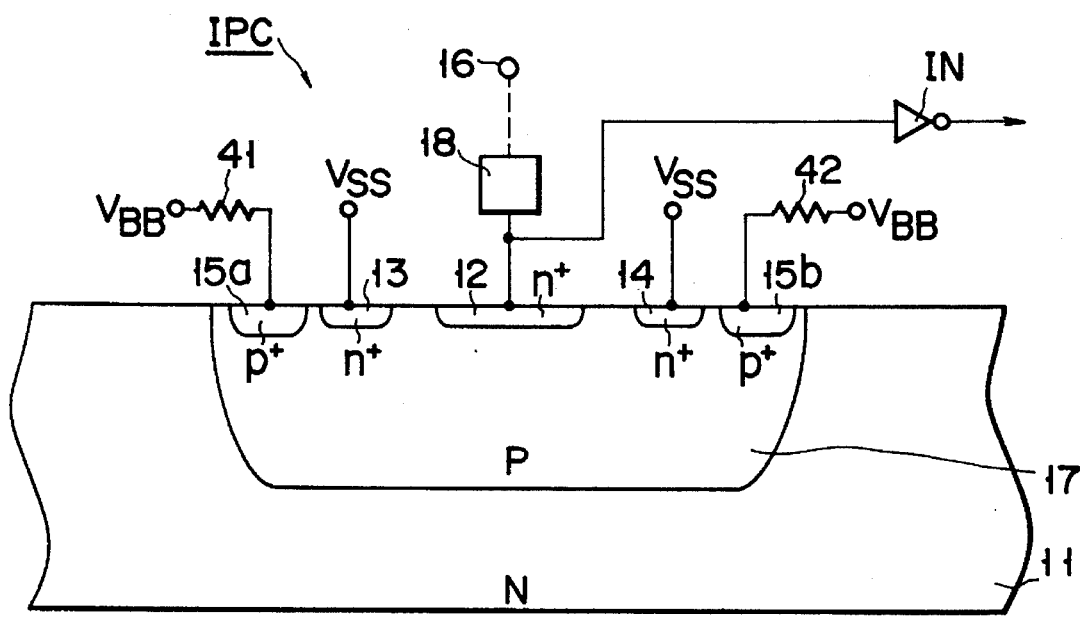
F I G. 13

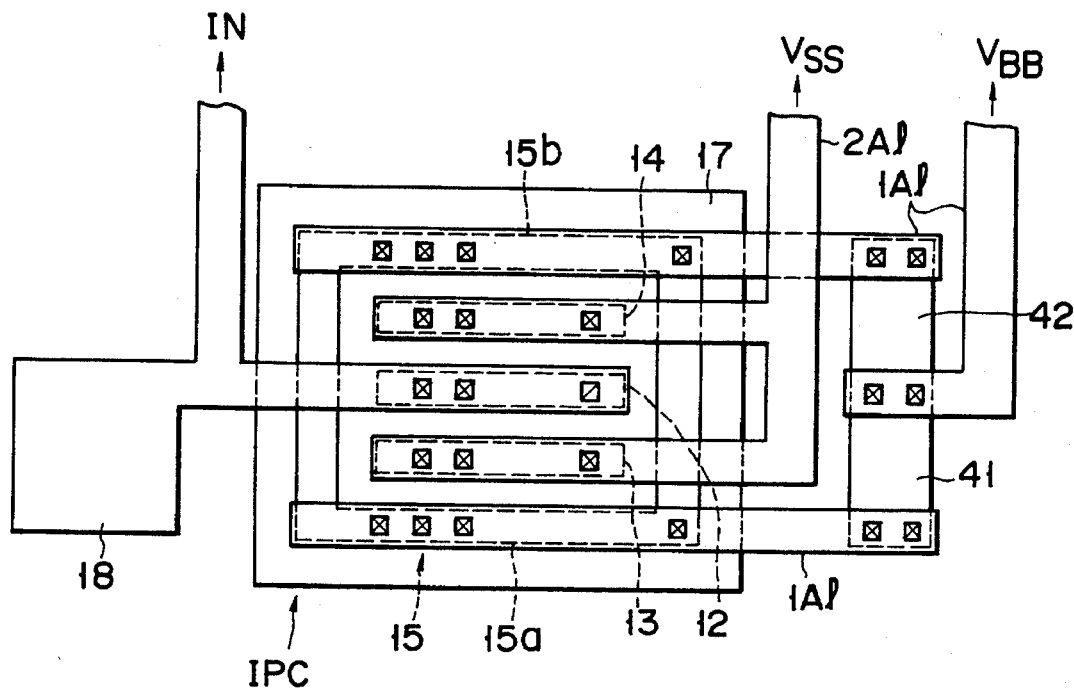
F I G. 14
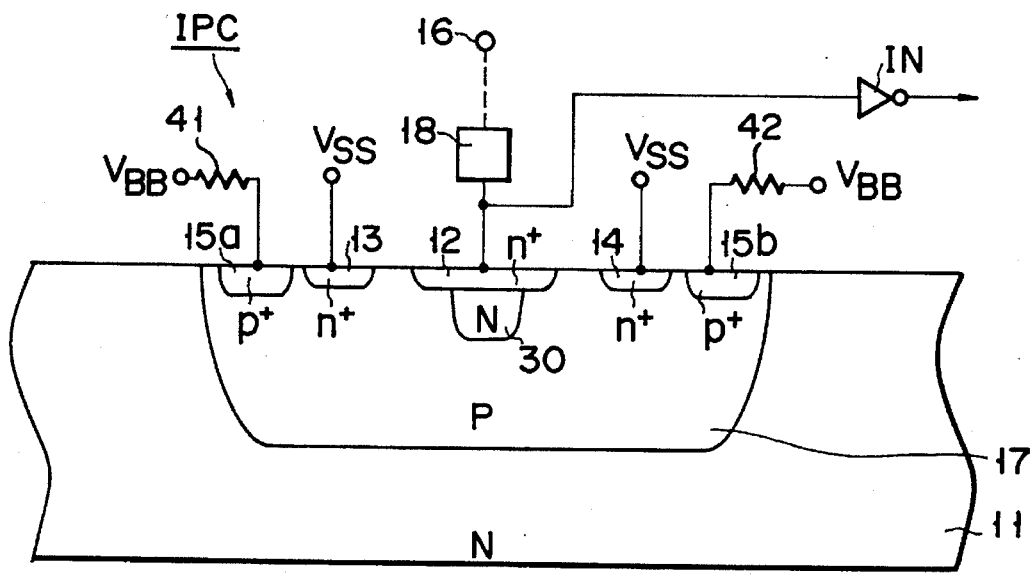
F I G. 15

5,594,265

INPUT PROTECTION CIRCUIT FORMED IN A SEMICONDUCTOR SUBSTRATE

BACKGROUND OF THE INVENTION

1. Field of the Invention

The present invention relates to a semiconductor device such as a large scale integrated circuit (LSI) and, more particularly, to an element structure of an input protection circuit section.

2. Description of the Related Art

In general, elements in the chip of a semiconductor device such as an LSI are broken down when a high voltage accidentally applied to external terminals of the semiconductor device or ESD (ElectroStatic Discharge) occurs, i.e., static electricity charged in a human body is discharged to the external terminals. As a countermeasure against this, an input protection circuit is generally arranged to protect the elements in the LSI.

FIG. 1 shows an element structure of an input protection circuit section in a conventional LSI, e.g., a 1-Mbit dynamic random access memory (DRAM). In FIG. 1, reference numeral 21 denotes a p-type semiconductor substrate; 22, an $n^+$-type first semiconductor region ($n^+$-type diffusion layer) formed in a part of the surface region of the p-type substrate 21 and connected to an input pad 25 for receiving an external signal; and 23 and 24, $n^+$-type second semiconductor regions ($n^+$-type diffusion layers), formed in a part of the surface region of the p-type substrate 21, for receiving a ground potential Vss. An input circuit section (not shown) of the LSI is connected to the input pad 25.

FIG. 2 shows an equivalent circuit of the input protection circuit section shown in FIG. 1. In FIG. 2, reference numeral 26 denotes a resistor component between the input pad 25 and the $n^+$-type diffusion layer 22, and the reference numeral 27 denotes a parasitic bipolar transistor (npn transistor) formed by the $n^+$-type diffusion layer 22, the p-type substrate 21, and the $n^+$-type diffusion layers 23 and 24. The base potential of the parasitic bipolar transistor 27 is equal to the potential of the substrate 21, and a back gate bias potential VBB is normally given as this potential.

In the input protection circuit section having the above arrangement, when a high voltage is accidentally applied to an external terminal (not shown) connected to the input pad 25 or electrostatic discharge occurs, an overcurrent flows from the $n^+$-type diffusion layer 22 connected to the input pad 25 to the $n^+$-type diffusion layers 23 and 24 to prevent breakdown of circuit elements in the LSI.

The base potential of the parasitic bipolar transistor 27 is equal to the back gate bias potential $V_{BB}$, and the back gate bias potential $V_{BB}$ is used in a transistor of a memory cell array section or cell peripheral circuit section (not shown) arranged on the semiconductor substrate 21. For this reason, when an overcurrent flows from an external terminal (not shown) to the input pad 25 due to electrostatic discharge, a large amount of current flows to the semiconductor substrate 21 to cause the substrate potential to be unstable, and the transistors of the memory cell array section or cell peripheral circuit section may be broken down.

In a test for an integrated circuit, a predetermined negative potential ($V_{IL}$) is applied to an external terminal (not shown) connected to the input pad 25. At this time, minority carriers generated by the $n^+$-type diffusion layer 22 connected to the input pad 25 flow into the semiconductor substrate 21 to cause the back gate bias potential $V_{BB}$ to be unstable. For this reason, in other sections except for the input protection circuit section, a transistor using the back gate bias potential $V_{BB}$ may be erroneously operated.

SUMMARY OF THE INVENTION

It is an object of the present invention to provide a semiconductor device having a highly reliable input protection circuit section in which, when electrostatic discharge causes an overcurrent to flow into an input pad for receiving an external signal, a substrate potential can be kept stable, breakdown of a transistor using the substrate potential can be prevented in other circuit sections except for the input protection circuit section.

It is another object of the present invention to provide a semiconductor device having a highly reliable input protection circuit section in which, when a negative test potential ($V_{IL}$) is applied to an input pad, a substrate potential can be kept stable, an erroneous operation of a transistor using the substrate potential can be prevented in other circuit sections except for the input protection circuit section.

In order to achieve the above objects, according to the present invention, there is provided a semiconductor device comprising:

a semiconductor substrate of a first conductivity type;

a well region of a second conductivity type formed in a part of a surface region of the semiconductor substrate;

a first semiconductor region of the first conductivity type formed in a part of a surface region of the well region and connected to an input pad for receiving an external signal;

a second semiconductor region of the first conductivity type and a third semiconductor region of the second conductivity type, formed in parts of the surface region of the well region, for receiving a predetermined potential;

wherein the well region includes no semiconductor region other than the first, second, and third semiconductor regions and is formed independently of other semiconductor circuits arranged in the semiconductor substrate.

According to the present invention, a parasitic bipolar transistor and a parasitic diode are formed in a well region independently of other circuit elements in a semiconductor substrate. The parasitic bipolar transistor and the parasitic diode are connected in parallel to an input pad. In addition, the base potential of the parasitic bipolar transistor is not equal to a back gate bias potential but equal to a constant potential such as a ground potential. Therefore, when a high voltage is accidentally applied to the input pad or electrostatic discharge occurs, an overcurrent flows into the parasitic bipolar transistor connected to the input pad so as to prevent breakdown of other circuit elements. In addition, when an overcurrent flows into the well region, a substrate potential does not become unstable, and breakdown of other circuit elements using the substrate potential can be prevented.

Assuming that the first and second conductivity types are set to be n and p types, respectively, in a test for a semiconductor device, even when a negative test potential ($V_{IL}$) is applied to the input pad to allow a current to flow into the parasitic diode, the substrate potential does not become unstable, breakdown of other circuit elements using the substrate potential can be prevented.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a sectional view showing the first embodiment of the present invention;

FIG. 4 is a plan view showing a pattern of the input protection circuit section shown in FIG. 3;

FIG. 5 is a circuit diagram showing an equivalent circuit of an input protection circuit section shown in FIG. 3;

FIG. 6 is a sectional view showing the second embodiment of the present invention;

FIG. 7 is a sectional view showing the third embodiment of the present invention;

FIG. 8 is a sectional view showing the fourth embodiment of the present invention;

FIG. 9 is a circuit diagram showing an equivalent circuit of the input protection circuit section shown in FIG. 8;

FIG. 10 is a sectional view showing the fifth embodiment of the present invention;

FIG. 11 is a plan view showing a pattern of a main part of FIG. 10;

FIG. 12 is a sectional view showing the sixth embodiment of the present invention;

FIG. 13 is a sectional view showing the seventh embodiment of the present invention;

FIG. 14 is a plan view showing a pattern of a main part of FIG. 13;

FIG. 15 is a sectional view showing the eighth embodiment of the present invention;

DETAILED DESCRIPTION OF THE PREFERRED EMBODIMENTS

Figure 1:
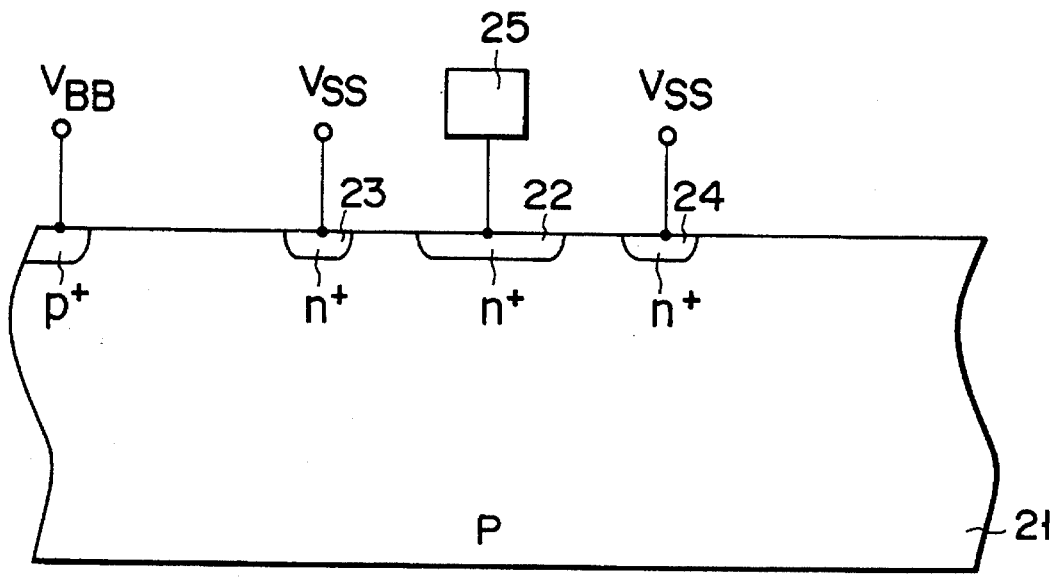
FIG. 1 is a sectional view showing an input protection circuit section of a conventional semiconductor device.
Figure 2:
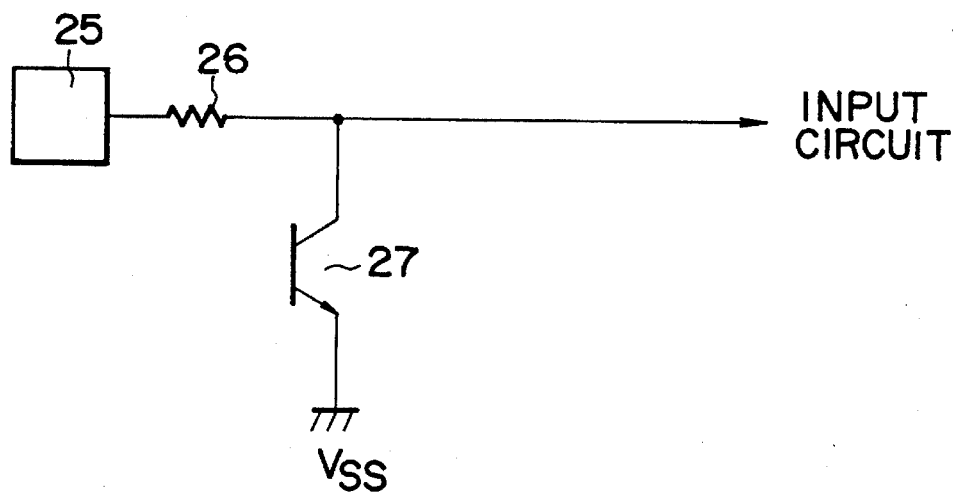
FIG. 2 is a circuit diagram showing an equivalent circuit of the input protection circuit section shown in FIG. 1.

Embodiments of the present invention will be described below with reference to the accompanying drawings.

FIGS. 3 and 4 show the first embodiment of the present invention and an element structure of an input protection circuit section of an LSI, e.g., 16-Mbit DRAM.

In an input protection circuit section IPC shown in FIGS. 3 and 4, a p-type well region (p-well region) 17 is formed in a part of the surface region of an n-type semiconductor substrate 11. An $n^+$-type first semiconductor region ($n^+$-type diffusion layer) 12 is formed in a part of the surface region of the p-well region 17, and an input pad 18 for receiving an external signal is connected to the first semiconductor region 12. The input pad 18 is arranged near the first semiconductor region 12 and connected to an input circuit IN of an integrated circuit constituted by, e.g., an inverter circuit and to an external terminal 16 for receiving an external signal.

$N^+$-type second semiconductor regions ($n^+$-type diffusion layers) 13 and 14 are formed on parts of the surface region of the p-well region 17 and on both the sides of the first semiconductor region 12. A constant potential, e.g., a ground potential Vss is applied to each of the second semiconductor regions 13 and 14. A $p^+$-type third semiconductor region ($p^+$-type diffusion layer) 15 is formed in a part of the surface region of the p-well region 17 around the second semiconductor regions 13 and 14. The third semiconductor region 15 is constituted by a part 15a formed along the second semiconductor region 13 and a part 15b formed along the second semiconductor region 14. A constant potential, e.g., the ground potential Vss, is applied to the third semiconductor region 15. Therefore, the potential of the well region 17 is set at the ground potential Vss through the third semiconductor region.

The well region 17 includes no semiconductor region other than the first, second, and third semiconductor regions 12, 13, 14, and 15. That is, as shown in FIG. 3, the input protection circuit section is formed in the independent well region 17, other circuits are formed in a p-type well region 17a arranged in the semiconductor substrate 11 independently of the well region 17. Memory cells MC for constituting a memory cell array section are formed in the well region 17a. Each of the memory cells MC is constituted by, e.g., a MOS transistor 17b and a capacitor 17c. In addition, in the well region 17a, a cell peripheral circuit section and the like are formed, and a $p^+$-type diffusion layer 17d is formed. A predetermined potential, e.g., the back gate bias potential $V_{BB}$ is applied to the $p^+$-type diffusion layer 17d. Therefore, the potential of the well region 17a is set at the potential $V_{BB}$ through the $p^+$-type diffusion layer 17d.

FIG. 5 shows the equivalent circuit of the input protection circuit section IPC shown in FIGS. 3 and 4. Reference numeral 19 denotes a parasitic transistor (npn transistor) formed by the $n^+$-type diffusion layer 12, the p-well region 17, and the $n^+$-type diffusion layers 13 and 14, and reference numeral 10 denotes a parasitic diode formed by the $n^+$-type diffusion layer 12, the p-well region 17, and the $p^+$-type diffusion layer 15.

With the above arrangement, the parasitic transistor 19 and the parasitic diode 10 are formed in the input protection circuit section IPC, and the input protection circuit section IPC is surrounded by the well region 17 in the n-type substrate 11 independently of the transistors constituting the memory cell array section or cell peripheral circuit section. In addition, the base potential of the parasitic transistor 19, i.e., the potential of the p-well region 17, is not set at the back gate bias potential $V_{BB}$ but set at the ground potential Vss.

When a high voltage is accidentally applied to the external terminal connected to the input pad 18 or electrostatic discharge occurs at the external terminal 16, an overcurrent flows into the parasitic transistor 19 connected to the input pad 18 but does not flow in the memory cell array section and the cell peripheral circuit section. Therefore, breakdown of the circuit elements in the integrated circuit can be prevented. In this case, even when a considerable amount of current flows into the p-well region 17 during the flow of the overcurrent into the parasitic transistor 19, the substrate current is kept stable, the transistors of the memory cell array section and the cell peripheral circuit section are not broken down.

In a test of the integrated circuit, when the negative input potential ($V_{IL}$) for the test is applied to the external terminal 16 connected to the input pad 18 to cause a current to flow into the parasitic diode 10, in this embodiment, the substrate potential can be kept stable. Therefore, transistors of other circuits except for the input protection circuit section IPC are not erroneously operated.

FIG. 6 shows the second embodiment of the present invention. The same reference numerals as in the first embodiment denote the same parts in FIG. 6, and a detailed description thereof will be omitted.

In the second embodiment, an n⁺-type diffusion layer 13 is connected to a p⁺-type diffusion layer 15a, and an n⁺-type diffusion layer 14 is connected to a p⁺-type diffusion layer 15b.

According to the second embodiment, the same effect as described in the first embodiment can be obtained. In this embodiment, in order to reinforce a counter-measure against electrostatic discharge, a diffusion layer 12 is preferably formed to be close to the n⁺-type diffusion layers 13 and 14 to increase an operation speed of a parasitic transistor 19.

FIG. 7 shows the third embodiment of the present invention. The same reference numerals as in the first embodiment denote the same parts in FIG. 7, and a detailed description thereof will be omitted.

In this embodiment, in a well region 17, an n-well region 30 is formed immediately below an n⁺-type diffusion layer 12. With this arrangement, upon electrostatic discharge, the n⁺-type diffusion layer 12 can be protected from an overcurrent by the n-well region 30, and breakdown of the n⁺-type diffusion layer 12 can be prevented.

FIG. 8 is the fourth embodiment of the present invention. The same reference numerals as in the first embodiment denote the same parts in FIG. 8, and a detailed description thereof will be omitted.

In this embodiment, a distance a between an n⁺-type diffusion layer 13 and a p⁺-type diffusion layer 15a and a distance a between an n⁺-type diffusion layer 14 and a p⁺-type diffusion layer 15b are set to be larger than a distance b between an n⁺-type diffusion layer 12 and an n⁺-type diffusion layer 13 and a distance b between the n⁺-type diffusion layer 12 and the n⁺-type diffusion layer 14. This distance b is set to be larger than the design rule of the integrated circuit.

FIG. 9 shows an equivalent circuit of the input protection circuit section IPC shown in FIG. 8. The same reference numerals as in the first embodiment denote the same parts in FIG. 9, and a detailed description thereof will be omitted.

In this embodiment, a parasitic resistor 20 is connected between the anode of a parasitic diode 10 and a ground potential Vss. The parasitic resistor 20 is a parasitic well resistor formed between the n⁺-type diffusion layer 12 and the p⁺-type diffusion layers 15a and 15b.

In this embodiment, the same effect as described in the first embodiment can be obtained. In addition, this embodiment is different from the first embodiment in the following description. That is, in the fourth embodiment, the p⁺-type diffusion layers 15a and 15b are formed at the outer peripheral portion of the well region 17, and the parasitic resistor 20 between the n⁺-type diffusion layer 12 and the p⁺-type diffusion layer 15a and the parasitic resistor 20 between the n⁺-type diffusion layer 12 and the p⁺-type diffusion layer 15b are set to have larger resistances than those of the first embodiment. For this reason, when a negative input potential ($V_{IL}$) for the test is applied and a negative potential lower than a ground potential Vss by a forward-bias potential $V_F$ of the parasitic diode 10 is input to a pad 18, the parasitic diode 10 is not easily turned on by the operation of the parasitic resistor 20. Therefore, no large current flows into the entire integrated circuit, no conventional malfunction occurs.

FIGS. 10 and 11 show the fifth embodiment of the present invention. The same reference numerals as in the first embodiment denote the same parts in FIGS. 10 and 11, and a detailed description thereof will be omitted.

In FIGS. 10 and 11, a p⁺-type diffusion layer 15a is connected to a ground potential Vss through a resistor element 31, and a p⁺-type diffusion layer 15b is connected to the ground potential Vss through a resistor element 32.

More specifically, as shown in FIG. 11, the p⁺-type diffusion layers 15a and 15b are connected to one terminal of the resistor element 31 and one terminal of the resistor element 32 through a first aluminum wiring layer 1A1, respectively. The other terminal of each of the resistor elements 31 and 32 is connected to the ground potential Vss through a second aluminum wiring layer 2A1 formed on the first aluminum wiring layer 1A1. This second aluminum wiring layer 2A1 is connected to n⁺-type diffusion layers 12 and 13. The resistor elements 31 and 32 are made of, e.g., polysilicon having a resistance of about 10 kΩ. Diffusion resistors can be used as the resistor elements 31 and 32.

In this embodiment, since the ground potential Vss applies a potential to the p⁺-type diffusion layers 15a and 15b through the resistor elements 31 and 32, respectively, the potentials of the p⁺-type diffusion layers 15a and 15b are lower than the ground potential Vss. Therefore, when a negative input potential ($V_{IL}$) for the test is applied to an input pad 18 such that the potential of the input pad 18 is set to be lower than the ground potential vss by the forward-bias voltage $V_F$ of the parasitic diode 10, the parasitic diode 10 is not easily turned on by the operations of the resistors 31 and 32. Therefore, no large current flows into the entire integrated circuit, and no conventional malfunction occurs.

With the above arrangement, when electrostatic discharge occurs or the negative input potential ($V_{IL}$) for the test is applied, the substrate potential can be kept stable, breakdown of transistors for constituting other circuits except for the input protection circuit section can be prevented.

FIG. 12 shows the sixth embodiment of the present invention. The same reference numerals as in the first embodiment denote the same parts in FIG. 12, and a detailed description thereof will be omitted.

In this embodiment, n⁺-type diffusion layers 13 and 14 are connected to a ground potential Vss, and p⁺-type diffusion layers 15a and 15b are connected to a back gate bias potential $V_{BB}$. This back gate bias potential $V_{BB}$ is set at, e.g., −2 to −3V, and set to be lower than the potential vss=0V of the n⁺-type diffusion layers 13 and 14.

In this embodiment, the n⁺-type diffusion layers 13 and 14 are set at the ground potential Vss, and the p⁺-type diffusion layers 15a and 15b are connected to the back gate bias potential $V_{BB}$ lower than the ground potential Vss. For this reason, when a negative input potential ($V_{IL}$) for test is applied such that the potential of an input pad 18 is set to be lower than the back gate bias potential $V_{BB}$ by a forward-bias voltage $v_F$ of a parasitic diode 10, the parasitic diode 10 is turned on. However, when the potential of the input pad 18 is set to be lower than the ground potential Vss by the forward-bias voltage $V_F$ of the parasitic diode 10, the parasitic diode is not turned on. Therefore, no large current flows into the entire integrated circuit, and no conventional malfunction occurs.

With the above arrangement, when electrostatic discharge occurs or the negative input potential ($V_{IL}$) for testing is applied, a substrate potential can be kept stable, breakdown of transistors for constituting other circuits except for the input protection circuit can be prevented.

FIGS. 13 and 14 show the seventh embodiment of the present invention. The same reference numerals as in the sixth embodiment denote the same parts in FIGS. 13 and 14, and a detailed description thereof will be omitted.

In this embodiment, a p$^+$-type diffusion layer 15a is connected to a back gate bias potential V$_{BB}$ through a resistor element 41, and a p$_+$-type diffusion layer 15b is connected to the back gate bias potential (for example, ground potential) V$_{BB}$ through a resistor element 42. The resistor elements 41 and 42 are constituted by, e.g., polysilicon. Diffusion resistors can be used as the resistor elements 41 and 42. According to the above arrangement, the same effect as described in the sixth embodiment can be obtained.

FIG. 15 shows the eighth embodiment of the present invention. The same reference numerals as in the seventh embodiment denote the same parts in FIG. 15, and a detailed description thereof will be omitted.

In this embodiment, in a well region 17, an n-well region 30 is formed immediately below an n$^+$-type diffusion layer 12. With the above arrangement, when electrostatic discharge occurs, the n$^+$-type diffusion layer 12 can be protected from an overcurrent by the n-well region 30, and breakdown of the n$^+$-type diffusion layer 12 can be prevented.

In the seventh embodiment, as a countermeasure against the electrostatic discharge, a back gate bias potential V$_{BB}$ may be arranged independently of the normal back gate bias potential, a leak path may be formed between the back gate bias potential V$_{BB}$ and the ground potential Vss, or a leak path may be formed between a power supply Vcc and the back gate bias potential V$_{BB}$. Therefore, a substrate potential upon the electrostatic discharge can be prevented from being unstable.

Figure 16:
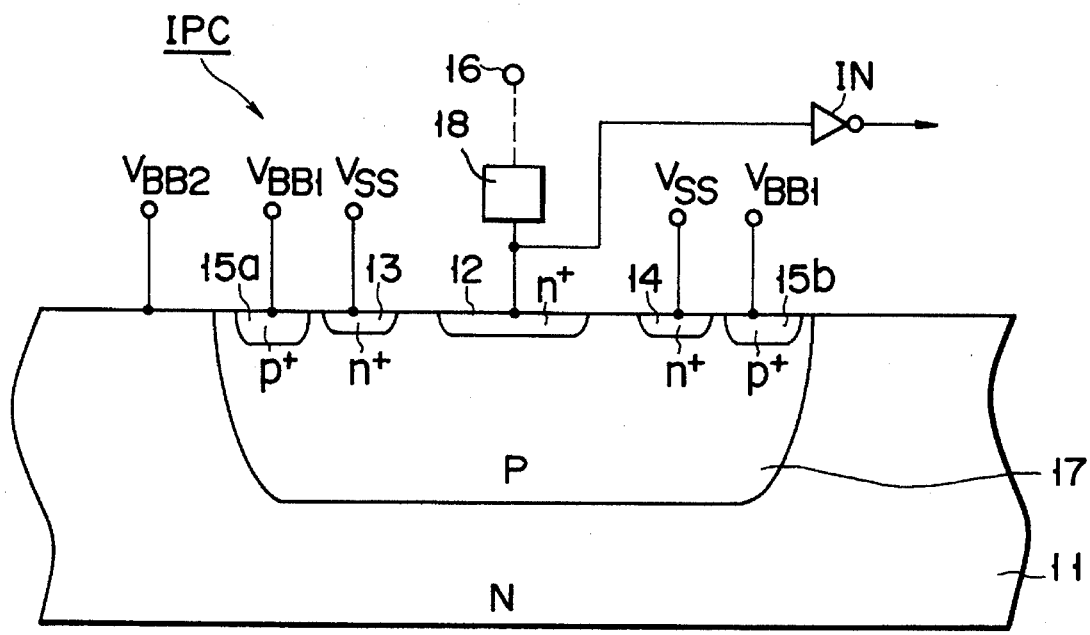
FIG. 16 is a sectional view showing the ninth embodiment of the present invention.
Figure 17:
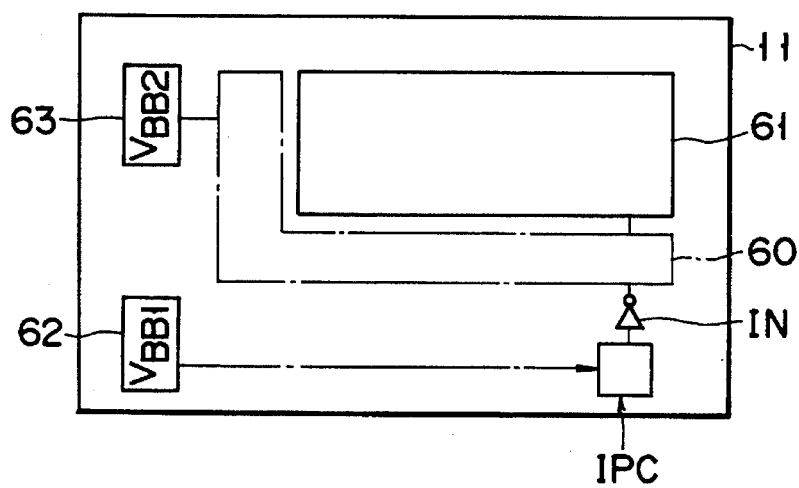
FIG. 17 is a view showing a circuit arrangement of a semiconductor device using the circuit shown in FIG. 16.

FIGS. 16 and 17 show the ninth embodiment of the present invention. The same reference numerals as in the sixth embodiment denote the same parts in FIGS. 16 and 17, and a detailed description thereof will be omitted.

In this embodiment, a ground potential Vss is applied to n$^+$-type diffusion layers 13 and 14, and a first back gate bias potential V$_{BB1}$ is applied to p$^+$-type diffusion layers 15a and 15b. The first back gate bias potential V$_{BB1}$ is set at, e.g., $-2$ to $-3$V and set to be lower than the potential Vss $=0$V of the n$^+$-type diffusion layers 13 and 14. A second back gate bias potential VBB$_2$ is applied to a semiconductor substrate 11.

That is, as shown in FIG. 17, in the semiconductor substrate 11, an input protection circuit section IPC, a peripheral circuit 60, and a memory cell array section 61 are arranged. In addition, in the semiconductor substrate 11, a first potential generating circuit 62 for generating the first back gate bias potential V$_{BB1}$ and a second potential generating circuit 63 for generating the second back gate bias potential VBB$_2$ are arranged. The first back gate bias potential V$_{BB1}$ is applied from the first potential generating circuit 62 to the input protection circuit section IPC, and the second back gate bias potential VBB$_2$ is applied from the second potential generating circuit 63 to the peripheral circuit 60 and the memory cell array section 61. The first and second back gate bias potentials VBB$_1$ and VBB$_2$ may be set to be equal to each other or set at potentials different from each other.

With the above embodiment, the back gate bias potential applied to the peripheral circuit 60 and the memory cell array section 61 is independent of the back gate bias potential applied to the input protection circuit section IPC. Therefore, when a negative potential is input to an input pad 18 to cause a large current to flow into a parasitic diode 10, an output potential of the first potential generating circuit 62 is changed through the p$^+$-type diffusion layers 15a and 15b. In this case, the input protection circuit section IPC is separated from other circuits by a well region 17, and an output potential of the first potential generating circuit 62 is not applied to other circuits except for the input protection circuit section IPC. For this reason, an erroneous operation of other circuits except for the input protection circuit section IPC, caused by noise generated by the large current, can be prevented.

Note that, in the fifth to eighth embodiments, the p$^+$-type diffusion layer 15 is not necessarily formed at the peripheral portion of the p-well region 17.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a semiconductor substrate of a first conductivity type;

a well region of a second conductivity type formed in a part of a surface region of said semiconductor substrate;

a first semiconductor region of the first conductivity type formed in a part of a surface region of said well region and connected to an input pad for receiving an external signal;

second semiconductor regions of the first conductivity type respectively formed at opposing sides of the first semiconductor region in the surface region of said well region, said second semiconductor regions being connected to a ground potential; and a third semiconductor region of the second conductivity type formed entirely within the surface region of said well region and connected to the ground potential, said third semiconductor region being arranged around said second semiconductor regions, wherein each of said second semiconductor regions contacts said third semiconductor region;

wherein said first semiconductor region, said well region, and said second semiconductor regions form a parasitic bipolar transistor between said input pad and the ground potential, and said first semiconductor region, said well region, and said third semiconductor region form a parasitic diode in parallel with said parasitic bipolar transistor between said input pad and the ground potential, and wherein said well region includes no semiconductor region other than said first, second, and third semiconductor regions and is formed independently of other semiconductor circuits arranged in said semiconductor substrate.

2. A semiconductor device comprising:

a semiconductor substrate of a first conductivity type;

a first well region of a second conductivity type formed in a first part of a surface region of said semiconductor substrate;

a memory circuit formed in said first well region;

a second well region of the second conductivity type formed in a second part of the surface region of said semiconductor substrate;

a first semiconductor region of the first conductivity type formed in a part of a surface region of said second well region, said first semiconductor region being connected to an input pad for receiving an external signal and to an input circuit for supplying the external signal to said memory circuit formed in said first well region;

a second semiconductor region of the first conductivity type formed in the surface region of said second well region and formed near said first semiconductor region, said second semiconductor region being connected to a ground potential; and a third semiconductor region of the second conductivity type formed entirely within the surface region of said second well region on a side of said second semiconductor region opposite to a side on which said first semiconductor region is formed, said third semiconductor region being connected to the ground potential.

3. A device according to claim 2, wherein said second well region includes no semiconductor region other than said first, second and third semiconductor regions.

4. A semiconductor device comprising:

a semiconductor substrate of a first conductivity type;

a well region of a second conductivity type formed in a part of a surface region of said semiconductor substrate;

a first semiconductor region of the first conductivity type formed in a part of a surface region of said well region, said first semiconductor region being connected to an input pad for receiving an external signal;

second semiconductor regions of the first conductivity type respectively formed at opposing sides of said first semiconductor region in the surface region of said well region; and a third semiconductor region of the second conductivity type formed in the surface region of said well region, said third semiconductor region being arranged around said second semiconductor regions, wherein said well region includes no semiconductor region other than said first, second, and third semiconductor regions and is formed independently of other semiconductor circuits arranged in said semiconductor substrate, said second semiconductor regions are connected to a first potential, and said third semiconductor region is connected to a second potential lower than the first potential, and wherein said first semiconductor region, said well region, and said second semiconductor regions form a parasitic bipolar transistor between said input pad and the first potential, and said first semiconductor region, said well region, and said third semiconductor region form a parasitic diode between said input pad and the second potential.

5. A device according to claim 4, wherein the first potential is a ground potential, and the second potential is a back gate bias potential.

6. A device according to claim 5, wherein the back gate bias potential is connected to said third semiconductor region through a resistor element.

7. A semiconductor device comprising:

a semiconductor substrate of a first conductivity type;

a well region of a second conductivity type formed in a part of a surface region of said semiconductor substrate;

a first semiconductor region of the first conductivity type formed in a part of a surface region of said well region, said first semiconductor region being connected to an input pad for receiving an external signal;

second semiconductor regions of the first conductivity type respectively formed at opposing sides of said first semiconductor region in the surface region of said well region; and a third semiconductor region of the second conductivity type formed in the surface region of said well region, said third semiconductor region being arranged around said second semiconductor regions, wherein said well region includes no semiconductor region other than said first, second, and third semiconductor regions and is formed independently of other semiconductor circuits arranged in said semiconductor substrate, said second semiconductor regions are connected to a ground potential, said third semiconductor region is connected to a first back gate bias potential lower than the ground potential, and said semiconductor substrate is connected to a second back gate bias potential different from the first back gate bias potential, and wherein said first semiconductor region, said well region, and said second semiconductor regions form a parasitic bipolar transistor between said input pad and the ground potential, and said first semiconductor region, said well region, and said third semiconductor region form a parasitic diode between said input pad and the first back gate bias potential.

8. A device according to claim 7, further comprising first and second potential generating circuits, arranged on said semiconductor substrate, for respectively generating the first and second back gate bias potentials.

9. A device according to claim 7, wherein the first conductivity type is an n type, and the second conductivity type is a p type.

10. A semiconductor device, comprising:

a semiconductor substrate of a first conductivity type;

a well region of a second conductivity type formed in a part of a surface region of said semiconductor substrate;

a first semiconductor region of the first conductivity type formed in a part of a surface region of said well region and connected to an input pad for receiving an external signal;

second semiconductor regions of the first conductivity type respectively formed at opposing sides of the first semiconductor region in the surface region of said well region; and a third semiconductor region of the second conductivity type formed entirely within the surface region of said well region, said third semiconductor region being arranged around said second semiconductor regions and said second semiconductor regions being in contact with said third semiconductor region, said second semiconductor regions and said third semiconductor region being connected to a ground potential, wherein said well region includes no semiconductor region other than said first, second, and third semiconductor regions and is formed independently of other semiconductor circuits arranged in said semiconductor substrate.

11. A semiconductor device, comprising:

a semiconductor substrate of a first conductivity type;

a well region of a second conductivity type formed in a part of a surface region of said semiconductor substrate;

a first semiconductor region of the first conductivity type formed in a part of a surface region of said well region and connected to an input pad for receiving an external signal, second semiconductor regions of the first conductivity type respectively formed at opposing sides of the first semiconductor region in the surface region of said well region, said second semiconductor regions being connected to a ground potential; and a third semiconductor region of the second conductivity type formed entirely within the surface region of said well region, said third semiconductor region being arranged around said second semiconductor regions, and said third semiconductor region being connected to the ground potential through a resistor, wherein said well region includes no semiconductor region other than said first, second, and third semiconductor regions and is formed independently of other semiconductor circuit arranged in said semiconductor substrate.

12. A semiconductor device comprising:

a semiconductor substrate of a first conductivity type;

a well region of a second conductivity type formed in a part of a surface region of said semiconductor substrate;

a first semiconductor region of the first conductivity type formed in a part of a surface region of said well region and connected to an input pad for receiving an external signal;

second semiconductor regions of the first conductivity type respectively formed at opposing sides of the first semiconductor region in the surface region of said well region, said second semiconductor regions being connected to a ground potential;

a third semiconductor region of the second conductivity type formed entirely within the surface region of said well region and connected to the ground potential, said third semiconductor region being arranged around said second semiconductor regions; and a resistor connected to said third semiconductor region, wherein said first semiconductor region, said well region, and said second semiconductor regions form a parasitic bipolar transistor between said input pad and the ground potential, and said first semiconductor region, said well region, and said third semiconductor region form a parasitic diode in parallel with said parasitic bipolar transistor between said input pad and the ground potential, and wherein said well region includes no semiconductor region other than said first, second, and third semiconductor regions and is formed independently of other semiconductor circuits arranged in said semiconductor substrate.

13. A semiconductor device comprising:

a semiconductor substrate of a first conductivity type;

a well region of a second conductivity type formed in a part of a surface region of said semiconductor substrate;

a first semiconductor region of the first conductivity type formed in a part of a surface region of said well region, said first semiconductor region being connected to an input pad for receiving an external signal;

second semiconductor regions of the first conductivity type respectively formed at opposing sides of said first semiconductor region in the surface region of said well region;

a third semiconductor region of the second conductivity type formed in the surface region of said well region, said third semiconductor region being arranged around said second semiconductor regions; and a fourth semiconductor region of the first conductivity type formed in said well region immediately below said first semiconductor region, an impurity concentration of said fourth semiconductor region being lower than an impurity concentration of said first semiconductor region, wherein said well region includes no semiconductor region other than said first, second, third, and fourth semiconductor region and is formed independently of other semiconductor circuits arranged in said semiconductor substrate, said second semiconductor regions are connected to a first potential, and said third semiconductor region is connected to a second potential lower than the first potential, wherein said first semiconductor region, said well region, and said second semiconductor regions form a parasitic bipolar transistor between said input pad and the first potential, and said first semiconductor region, said well region, and said third semiconductor region form a parasitic diode between said input pad and the second potential, and wherein the first potential is a ground potential and the second potential is a back gate bias potential.

\* \* \* \* \*